United States Patent
Sugiyama et al.

(10) Patent No.: US 6,774,390 B2
(45) Date of Patent: Aug. 10, 2004

(54) SEMICONDUCTOR DEVICE

(75) Inventors: Naoharu Sugiyama, Yokohama (JP); Tsutomu Tezuka, Yokohama (JP); Tomohisa Mizuno, Yokohama (JP); Shinichi Takagi, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/369,662

(22) Filed: Feb. 21, 2003

(65) Prior Publication Data

US 2003/0227036 A1 Dec. 11, 2003

(30) Foreign Application Priority Data

Feb. 22, 2002 (JP) ........................................ 2002-045597

(51) Int. Cl.[7] ...................... H01L 29/06; H01L 31/072; H01L 31/079; H01L 31/0328; H01L 31/0336
(52) U.S. Cl. ............................ 257/19; 257/15; 257/18; 257/20; 257/347
(58) Field of Search ............................ 257/15, 18, 19, 257/20

(56) References Cited

U.S. PATENT DOCUMENTS

| | | | | |
|---|---|---|---|---|
| 5,854,509 A | * | 12/1998 | Kunikiyo | 257/506 |
| 5,963,817 A | * | 10/1999 | Chu et al. | 438/410 |
| 6,251,751 B1 | * | 6/2001 | Chu et al. | 438/439 |
| 6,326,667 B1 | | 12/2001 | Sugiyama et al. | |
| 6,369,438 B1 | | 4/2002 | Sugiyama et al. | |
| 6,483,148 B2 | * | 11/2002 | Chan et al. | 257/347 |
| 6,525,403 B2 | * | 2/2003 | Inaba et al. | 257/618 |
| 2002/0008289 A1 | * | 1/2002 | Murota et al. | 257/369 |
| 2003/0168700 A1 | * | 9/2003 | Mimura et al. | 257/347 |
| 2003/0227036 A1 | * | 12/2003 | Sugiyama et al. | 257/288 |
| 2004/0014304 A1 | * | 1/2004 | Bhattacharyya | 438/570 |

OTHER PUBLICATIONS

Tezuka, T. et al., "Integrated Circuit Device", U.S. patent application No. 10/188,824, filed on Jul. 5, 2002.

* cited by examiner

*Primary Examiner*—Jerome Jackson
*Assistant Examiner*—Jesse A. Fenty
(74) *Attorney, Agent, or Firm*—Finnegan, Henderson, Farabow, Garrett & Dunner, L.L.P.

(57) ABSTRACT

A semiconductor device includes an insulating layer, a semiconductor board formed on a selected portion of the insulating layer, a semiconductor layer formed on at least one of the major side surfaces of the semiconductor board, which is different from the semiconductor board in lattice constant, and having source and drain regions and a channel region therebetween, the area of the channel region being larger than that of the bottom surface of the semiconductor board, which contacts the insulating layer, and a gate electrode formed on the channel region via a gate insulating layer.

20 Claims, 14 Drawing Sheets

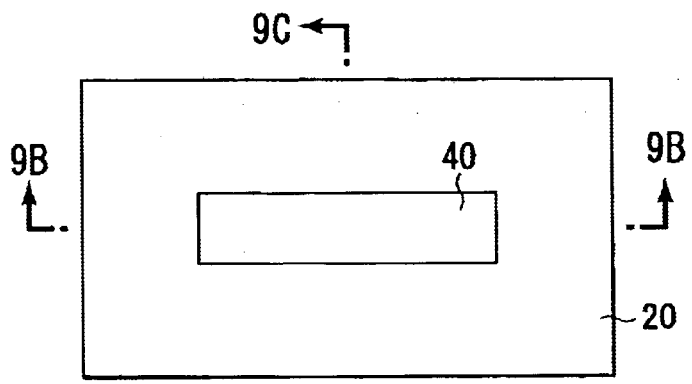
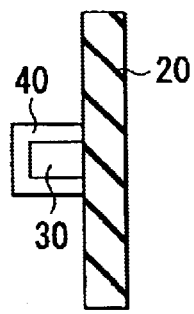
FIG. 9A    FIG. 9C
FIG. 9B
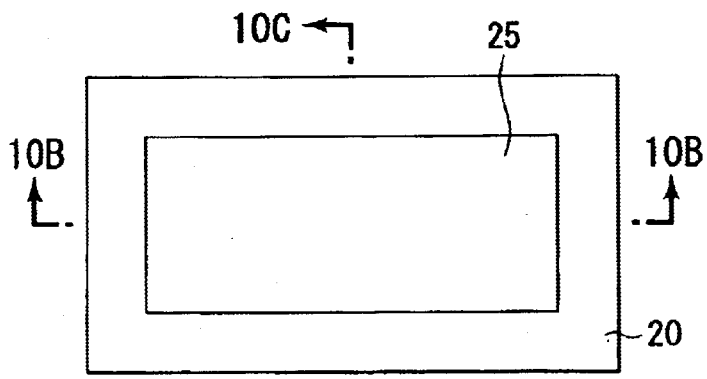
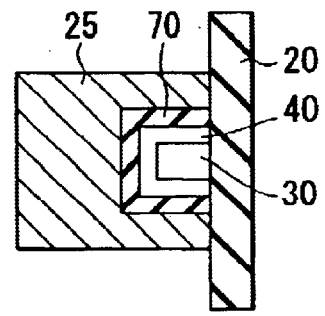
FIG. 10A    FIG. 10C
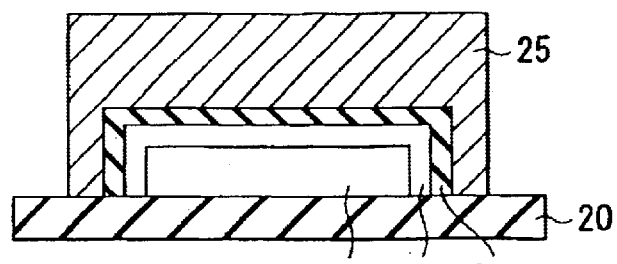
FIG. 10B

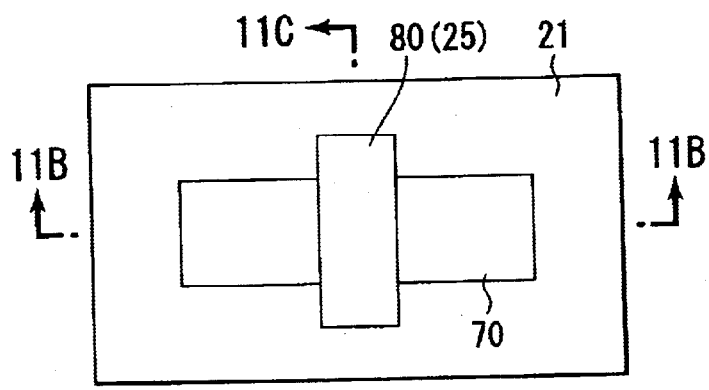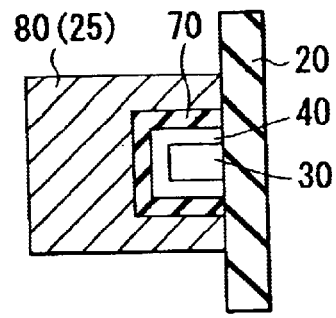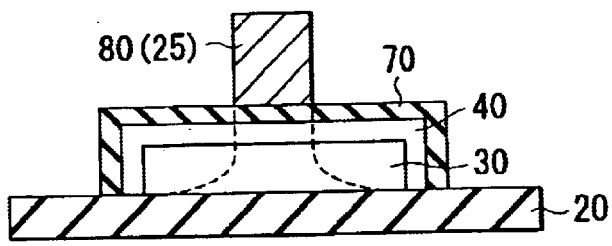
FIG. 11A  FIG. 11C
FIG. 11B
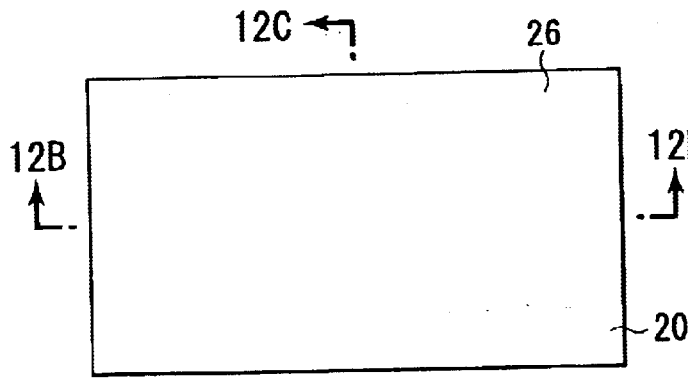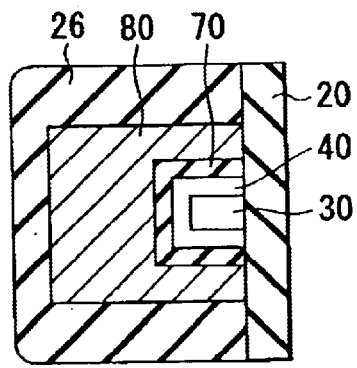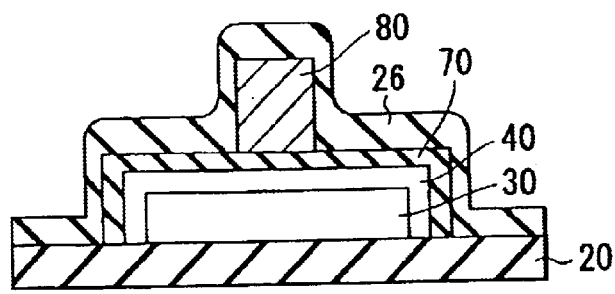
FIG. 12A  FIG. 12C
FIG. 12B

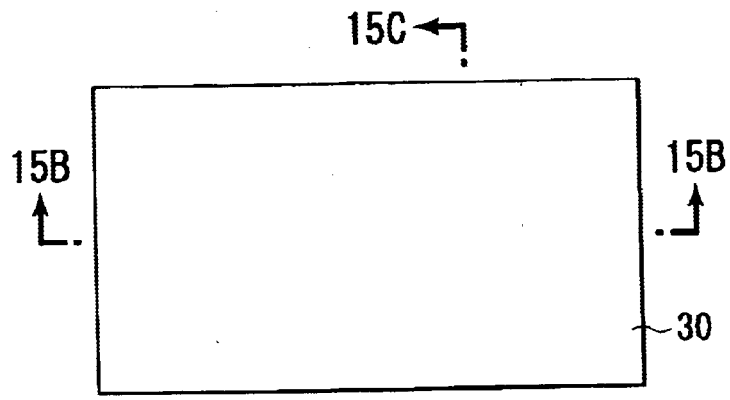
FIG. 15A
FIG. 15C
FIG. 15B
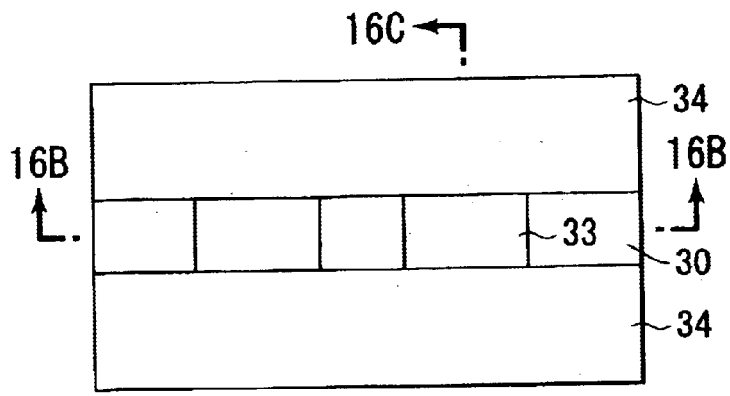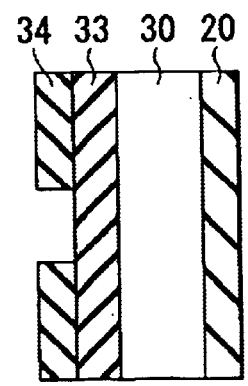
FIG. 16A
FIG. 16C
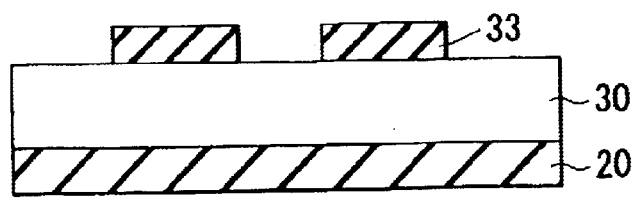
FIG. 16B

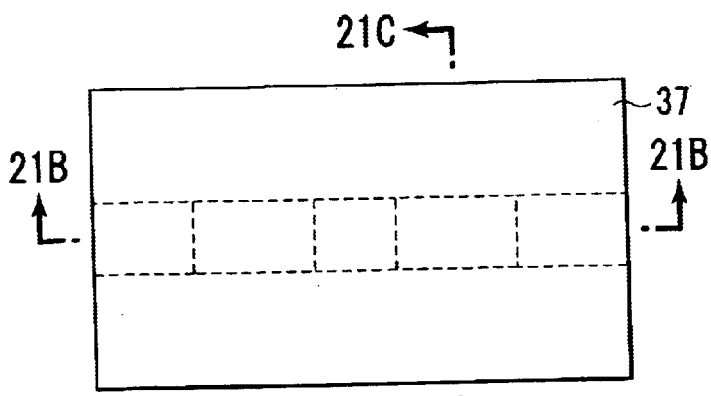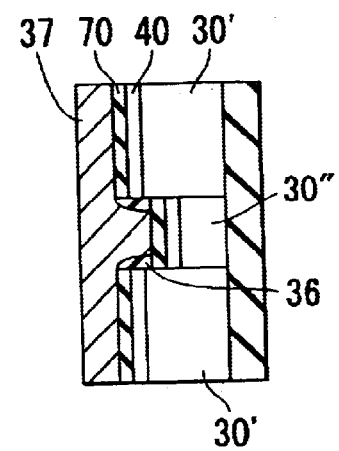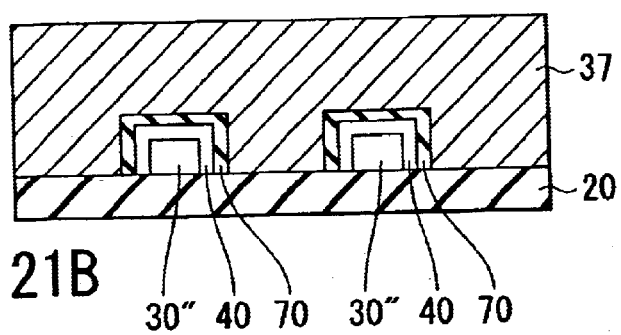
FIG. 21A
FIG. 21C
FIG. 21B
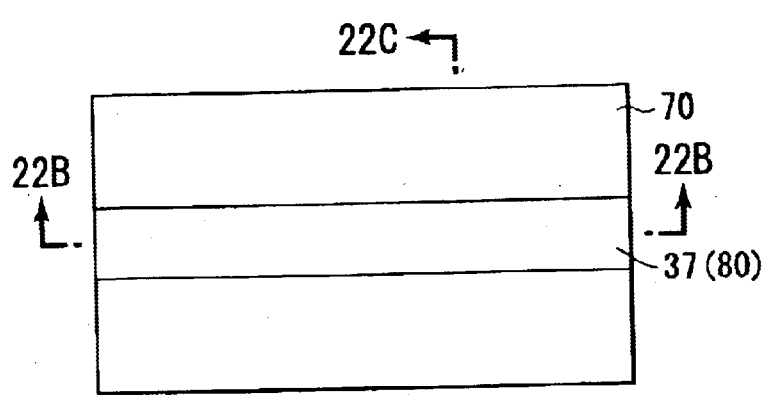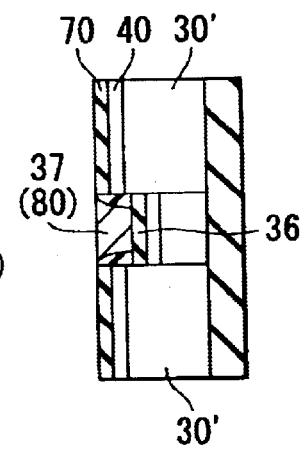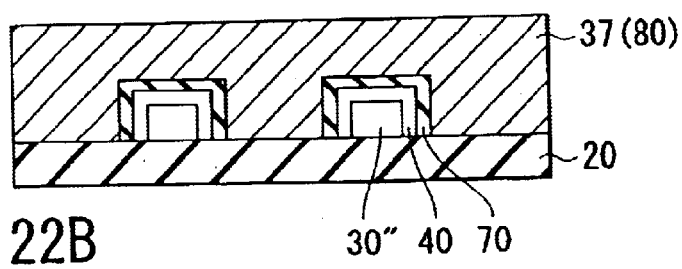
FIG. 22A
FIG. 22C
FIG. 22B

SEMICONDUCTOR DEVICE

CROSS-REFERENCE TO RELATED APPLICATIONS

This application is based upon and claims the benefit of priority from the prior Japanese Patent Application No. 2002-045597, filed Feb. 22, 2002, the entire contents of which are incorporated herein by reference.

BACKGROUND OF THE INVENTION

1. Field of the Invention

The present invention relates to a semiconductor device using a MIS field effect transistor.

2. Description of the Related Art

Silicon MOS field effect transistors (MOSFETs) as the mainstream of current semiconductor devices have simultaneously achieved micropatterning of elements, particularly high-density integration and larger driving force by reduction in gate length. However, it has been pointed out that element micropatterning complying with the conventional trend will reach physical and economical limits sooner or later. A technique for higher speeds and smaller power consumption by a method other than micropatterning must be established.

It has been known that the electron and hole mobilities increase in a Si crystal to which stress strain is applied. High-performance devices in which this characteristic is applied to the channel of a MIS (Metal Insulator Semiconductor) field effect transistor (MISFET) have been manufactured as prototypes.

More specifically, a MISFET using a semiconductor substrate in which a SiGe crystal layer slightly larger in lattice constant than the Si crystal is used as an underlayer and a Si thin layer is stacked on the SiGe crystal layer to form a strained Si layer has been proposed. In the MISFET, the carrier exhibits high mobility in the strained Si layer. By using the strained Si layer as a channel region, a high speed and small power consumption can be realized.

On the other hand, a high channel impurity concentration for suppressing the short channel effect of the MISFET increases the parasitic capacitance of the source/drain diffusion layer. It is known that the parasitic capacitance can be effectively reduced by using, for example, a semiconductor substrate having an SOI (Silicon On Insulator) structure in which an insulating layer is formed on a silicon wafer and a semiconductor layer is formed on the insulating layer.

From this, a MISFET using a semiconductor substrate in which a silicon wafer/SiGe crystal layer/Si oxide layer (insulating layer)/SiGe crystal layer/strained Si layer are formed has been proposed.

However, this structure suffers many defects on the interface between the insulating layer and the SiGe crystal layer, posing the following problem. That is, this structure is inferior in interface characteristic to an interface between the Ge-free Si layer and insulating layer of a general SOI substrate. Further, this structure has a larger leakage current than that in a MISFET using an unstrained Si layer of the SOI as a channel.

Demands have, therefore, arisen for the implementation of a semiconductor device having a MISFET improved such that defects on the interface between the insulating layer and the SiGe crystal layer and the like do not adversely affect the leakage current characteristic and the like in a MISFET using the strained Si layer as a channel layer.

BRIEF SUMMARY OF THE INVENTION

A semiconductor device according to a first aspect of the invention comprises
an insulating layer having a major surface;
a semiconductor board formed on a selected portion of the major surface of the insulating layer, the semiconductor board having a bottom surface in contact with the major surface of the insulating layer, at least two planar major side surfaces in parallel to each other, and substantially perpendicular to the major surface of the insulating layer, and an upper surface opposed to the bottom surface;
a semiconductor layer formed on at least one of the major side surfaces of the semiconductor board, the semiconductor layer having a lattice constant different from that of the semiconductor board, and having source and drain regions spaced apart from each other and a channel region between the source and drain regions, a channel length direction of the channel region being substantially parallel to the major surface of the insulating layer, and an area at a surface of the channel region being larger than an area of the bottom surface of the semiconductor board;
a gate insulating layer formed on the channel region of the semiconductor layer; and
a gate electrode formed on the gate insulating layer.

A semiconductor device according to a second aspect of the invention comprises
an insulating layer having a major surface;
a p-type semiconductor board formed on a first selected portion of the major surface of the insulating layer, the p-type semiconductor board having a bottom surface in contact with the major surface of the insulating layer, at least two planar major side surfaces in parallel to each other, and substantially perpendicular to the major surface of the insulating layer, and an upper surface opposed to the bottom surface of the p-type semiconductor board;
a first semiconductor layer formed on at least one of the major side surfaces of the p-type semiconductor board, the first semiconductor layer having a lattice constant different from that of the p-type semiconductor board and having n-type source and drain regions spaced apart from each other and a first channel region provided in a p-type region between the n-type source and drain regions, a channel length direction of the first channel region being substantially parallel to the major surface of the insulating layer, and an area at a surface of the first channel region being larger than an area of the bottom surface of the p-type semiconductor board;
a first gate insulating layer formed on the first channel region of the first semiconductor layer;
a first gate electrode formed on the first gate insulating layer;
an n-type semiconductor board formed on a second selected portion of the major surface of the insulating layer, the n-type semiconductor board having a bottom surface in contact with the major surface of the insulating layer, at least two planar major side surfaces in parallel to each other, and substantially perpendicular to the major surface of the insulating layer, and an upper surface opposed to the bottom surface of the n-type semiconductor board;
a second semiconductor layer formed on at least one of the major side surfaces of the n-type semiconductor board, the second semiconductor layer having a lattice constant different from that of the n-type semiconductor board and having p-type source and drain regions spaced apart from each other and a second channel region provided in an n-type region between the p-type source and drain regions, a channel length direction of the second channel region being substantially parallel to the major surface of the insulating layer, and an area at a surface of the second channel region being larger than an area of the bottom surface of the n-type semiconductor board;

a second gate insulating layer formed on the second channel region of the second semiconductor layer; and a second gate electrode formed on the second gate insulating layer.

A semiconductor substrate manufacturing method suitable for forming a CMIS semiconductor device comprises forming a mask having a silicon oxide layer and a silicon nitride layer stacked on the silicon oxide layer selectively formed on a silicon layer of a semiconductor substrate, the semiconductor substrate having an insulating layer and the silicon layer stacked on the insulating layer, stacking a SiGe layer on the silicon layer except a portion where the mask is formed, performing thermal oxidation processing for the semiconductor substrate to form an oxide layer on a surface of the SiGe layer and at the same time change a multilayered structure of the SiGe layer and the silicon layer into a single SiGe layer, and removing the oxide layer and the mask.

A semiconductor device according to a third aspect of the present invention comprises an insulating layer having a major surface;

a first semiconductor board formed on a first selected portion of the major surface of the insulating layer, the first semiconductor board having a bottom surface in contact with the major surface of the insulating layer, at least two planar major side surfaces in parallel to each other and substantially perpendicular to the major surface of the first insulating layers, and an upper surface opposed to the bottom surface of the first semiconductor board;

a first semiconductor layer formed on at least one of the major side surfaces of the first semiconductor board, the first semiconductor layer having a lattice constant different from that of the first semiconductor board, and having a first source region and a first drain region spaced apart from each other and a first channel region provided between the first source region and the first drain region, a channel length direction of the first channel region being substantially parallel to the major surface of the insulating layer, and an area at a surface of the first channel region being larger than an area of the bottom surface of the first semiconductor board;

a first gate insulating layer formed on the first channel region of the first semiconductor layer;

a first gate electrode formed on the first gate insulating layer;

a second semiconductor board formed on a second selected portion of the major surface of the insulating layer, the second semiconductor board having a bottom surface in contact with the major surface of the insulating layer, at least two planar major side surfaces in parallel to each other and substantially perpendicular to the major surface of the second insulating layers, and an upper surface opposed to the bottom surface of the second semiconductor board;

a second semiconductor layer formed on at least one of the major side surfaces of the second semiconductor board, the second semiconductor layer having a lattice constant different from that of the second semiconductor board, and having a second source region and a second drain region spaced apart from each other and a second channel region provided between the second source region and the second drain region, a channel length direction of the second channel region being substantially parallel to the major surface of the insulating layer, and an area at a surface of the second channel region being larger than an area of the bottom surface of the second semiconductor board;

a second gate insulating layer formed on the second channel region of the second semiconductor layer;

a second gate electrode formed on the second gate insulating layer.

BRIEF DESCRIPTION OF THE SEVERAL VIEWS OF THE DRAWING

FIGS. 9 to 14 are views, respectively, showing the steps of the manufacturing process after formation of the gate electrode of the MISFET according to the second embodiment, in which views with a suffix A are plan views, and views with suffixes B and C are sectional views taken along lines numbered with the suffixes B and C in corresponding views;

FIGS. 15 to 22 are views, respectively, showing the steps of a MISFET manufacturing process according to the third embodiment, in which views with a suffix A are plan views, and views with suffixes B and C are sectional views taken along lines numbered with the suffixes B and C in corresponding views;

DETAILED DESCRIPTION OF THE INVENTION

Figure 1:
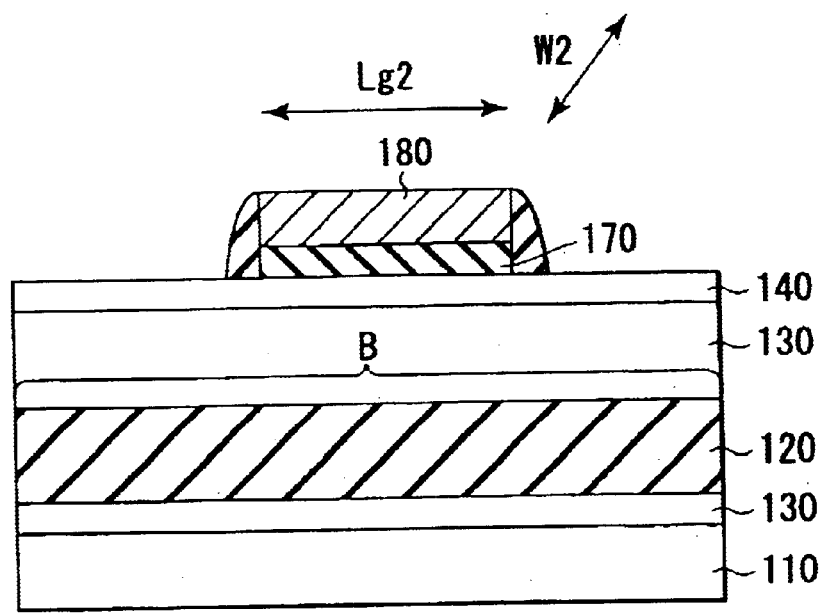
FIG. 1 is a sectional view showing a MISFET using a conventional strained Si layer as a channel.

Prior to the description of the embodiments, the problem of a MISFET using a strained Si layer as a channel, and the effects of the embodiments which solve this problem will be explained. As shown in FIG. 1, in a conventional MISFET, SiGe crystal layers 130 thick enough to satisfactorily relax the stress, an insulating layer 120 sandwiched between the SiGe crystal layers 130, and a strained Si layer 140 epitaxially grown on the upper SiGe crystal layer 130 are formed on a Si substrate 110.

The conventional MISFET further comprises a gate insulating layer 170 formed on the surface of the strained Si layer 140, a gate electrode 180 formed on the gate insulating layer 170, and source and drain regions formed by doping an impurity by using the gate electrode 180 as a mask. When the transistor operates, a channel is formed in the strained Si layer 140.

However, this structure has many defects on the interface between the insulating layer 120 and the SiGe crystal layer 130, and is inferior in interface characteristic to a Ge-free interface between the Si layer and insulating layer of a general SOI. Also, this structure has a larger leakage current than that in a MISFET using an unstrained Si layer of the SOI as a channel.

The present invention has been made to solve this problem, relates to a MISFET using, as a channel layer, a second semiconductor layer such as a strained Si layer which is joined to a first semiconductor layer such as a SiGe crystal layer formed on an insulating layer, has a lattice constant different from that of the first semiconductor layer, and has a stress strain in crystal lattices, and also relates to a CMIS circuit which is combined with the MISFET.

In the MISFET, the second semiconductor layer is joined to at least one of the major side surfaces of the first projecting semiconductor layer which is formed on the insulating layer in a board-like shape. In forming a gate on the second semiconductor layer, the gate is formed such that the area of a channel portion in the surface of the second semiconductor layer is set smaller than the junction area between the SiGe layer and the insulating layer. The junction area between the insulating layer and the SiGe layer is decreased with respect to the transistor element size, reducing the adverse effect of interface defects and the like.

When the first semiconductor layer is formed from a SiGe crystal layer and the second semiconductor layer is formed from strained Si, the strained Si layer which covers the surface of the SiGe crystal layer functions as a channel. It has been reported that the electron and hole mobilities increase in the strained Si channel, compared to a general Si layer. Hence, a high-performance MISFET in which the carrier exhibits high mobility can be manufactured from even a p-channel MISFET or n-channel MISFET.

As the mobility of electrons is enhanced at (100) plane and that of holes is enhanced at (100) or (110) plane, utilization of these planes enables manufacturing of MISFETs having higher performance.

When the first semiconductor layer is formed from a Si crystal layer and the second semiconductor layer is formed from a strained SiGe crystal layer, the strained SiGe crystal layer which covers the surface functions as a channel. The structure using the strained SiGe crystal layer as a channel increases the hole mobility, and is suitable as a p-channel MISFET.

In the present invention, a desirable range of the Ge composition in the SiGe layer is 5 atomic % (inclusive) to 80 atomic % (inclusive), and preferably 50 atomic % or less. This setting generates a proper crystal strain between the SiGe layer and the adjacent Si layer.

Using the above structure, both n- and p-channel MISFETs can be formed and combined into a high-speed complementary field effect transistor circuit with high carrier mobility.

More specifically, an n-channel MISFET in which the first semiconductor layer of the n-channel MISFET is formed from a SiGe crystal layer, the second semiconductor layer is formed from strained Si, and the strained Si layer functions as a channel is formed. A p-channel MISFET in which the third semiconductor layer of the p-channel MISFET is formed from a SiGe crystal layer, the fourth semiconductor layer is formed from strained Si, and the Si layer functions as a channel is formed. The carrier exhibits high mobility in the two transistors in the use of a combination of these MISFETs, and thus a high-speed complementary field effect transistor circuit can be formed.

Alternatively, a transistor in which the third semiconductor layer is formed from a Si crystal layer, the fourth semiconductor layer is formed from a strained SiGe crystal layer, and the strained SiGe layer functions as a channel is used as a p-channel MISFET. A transistor in which the first semiconductor layer is formed from a SiGe crystal layer, the second semiconductor layer is formed from strained Si, and strained Si functions as a channel is used as an n-channel MISFET. Also in this complementary field effect transistor circuit, the carrier exhibits high mobility in the two transistors. A high-speed complementary field effect transistor circuit can be formed.

Only one field effect transistor in the complementary field effect transistor circuit may be a MISFET according to the present invention. For example, a MISFET which exhibits high hole mobility and uses a relaxed SiGe layer as a channel (in this case, the first and second semiconductor layers need not be stacked) may be adopted as a p-channel MISFET, and a MISFET which uses a strained Si layer according to the present invention as a channel may be adopted as an n-type MISFET.

To manufacture the above-described complementary field effect transistor circuit, a substrate in which a silicon layer region and relaxed SiGe layer region coexist on the same plane of an insulating layer must be prepared. In other words, designated positions on the substrate must be made of Si and SiGe. Semiconductor substrate manufacturing methods according to the embodiments mentioned later can easily manufacture such a substrate.

Semiconductor devices according to the embodiments of the present invention will be described below with reference to the several views of the accompanying drawing.

(First Embodiment)

Figure 2:
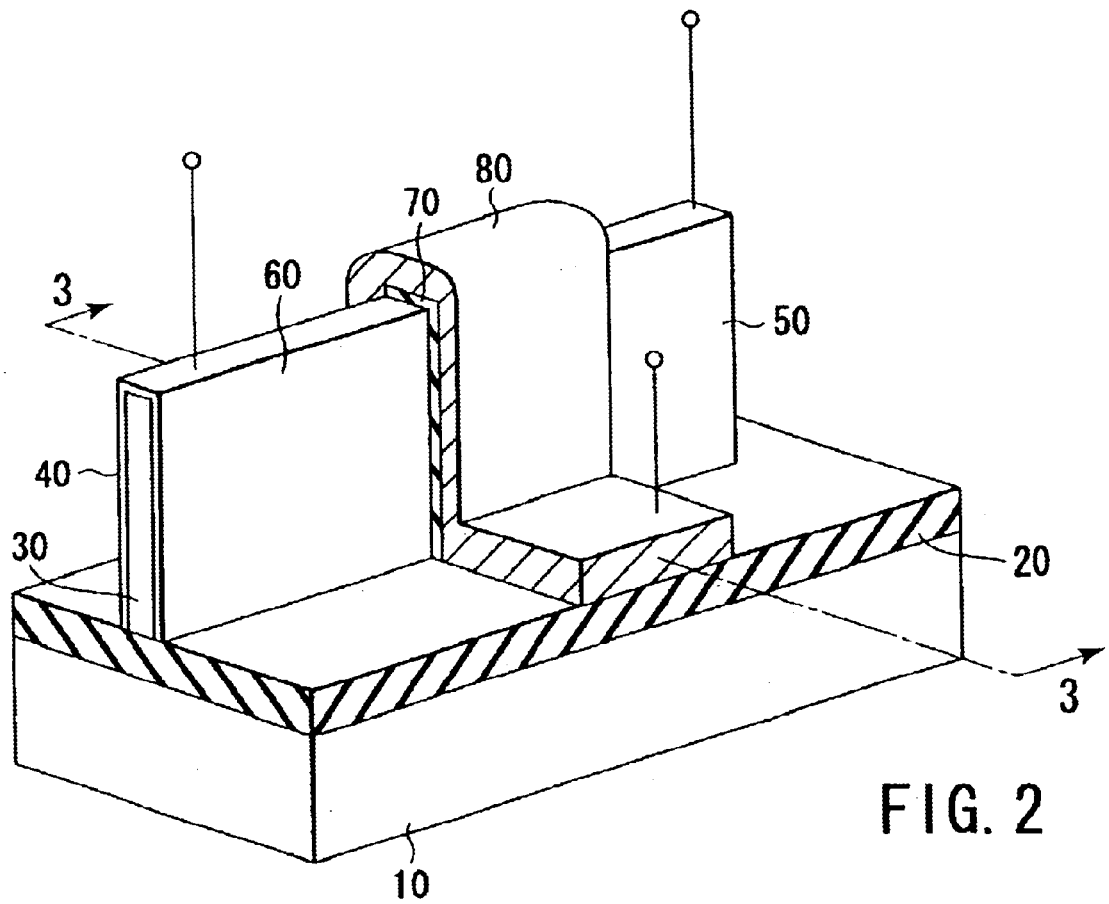
FIG. 2 is a schematic perspective view showing a MISFET according to the first embodiment of the present invention.
Figure 3A:
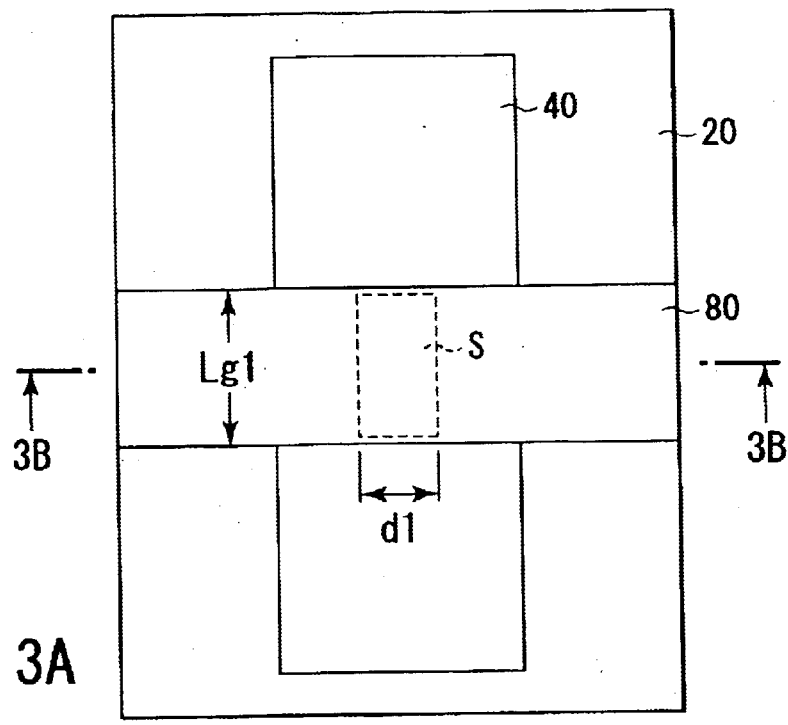
FIG. 3A is a plan view showing the MISFET according to the first embodiment.
Figure 3B:
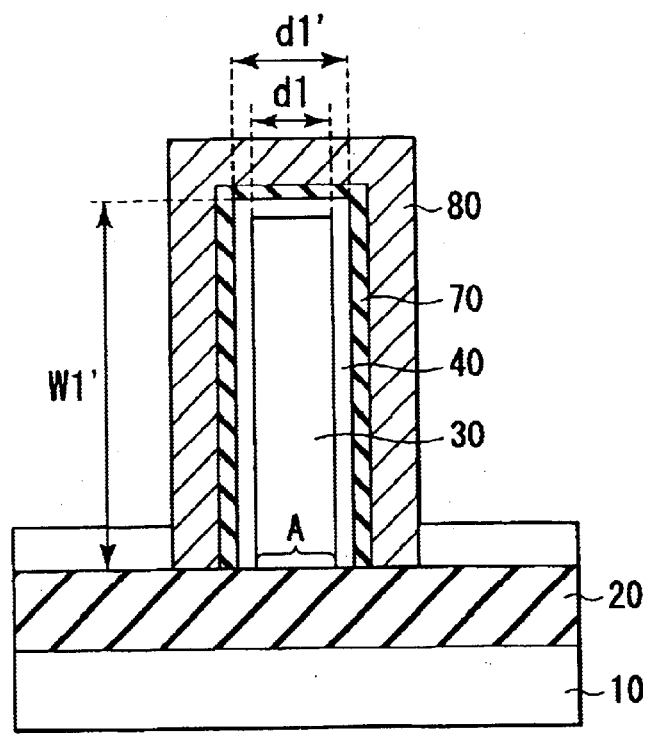
FIG. 3B is a sectional view taken along the line 3B—3B in FIG. 3A.

In a MISFET according to the first embodiment, as shown in FIGS. 2, 3A, and 3B, an insulating layer 20 such as silicon oxide is formed on a semiconductor substrate 10, and a projecting SiGe layer (semiconductor board) 30 is formed on the insulating layer 20. A strained Si layer (semiconductor layer) 40 is formed on the side and upper surfaces of the SiGe layer 30 so as to cover this SiGe layer 30. The strained Si layer 40 suffices to be formed on at least one of the vertical surfaces of the SiGe layer 30. The strained Si layer 40 may be continuously formed on the vertical surfaces in parallel to each other and horizontal upper surface, as shown in FIG. 2.

A band-like gate electrode 80 is so formed as to cover the vertical surfaces and horizontal upper surface of the strained Si layer 40 via a gate insulating layer 70. Those portions of the strained Si layer 40 that are not covered with the gate insulating layer 70 and gate electrode 80 serve as a source region 50 and drain region 60 which are activated by heavily doping an impurity. A channel is formed in the strained Si layer 40 covered with the gate electrode 80 between the source region 50 and the drain region 60 such that a current flows parallel to the surface of the insulating layer 20.

The gate electrode 80 applies the field effect to the channel via the gate insulating layer 70, and performs three-terminal field effect transistor operation. This structure can be similarly manufactured for both p- and n-channel MISFETs.

Letting $\sigma_1$ be the junction area between the insulating layer 20 and the SiGe layer (first semiconductor layer) 30 in one transistor (i.e., the area of the bottom surface of the insulating layer 20 that is represented by S in FIG. 3A and A in FIG. 3B), $d_1$ be the width of the SiGe layer 30, and $Lg_1$ be the gate length (depth in FIG. 3B corresponding to the channel length), $\sigma_1 = d_1 \times Lg_1$.

Letting $\phi_1$ be the area (element area) of the channel formation surface of one transistor, $d_1'$ be the width of the second semiconductor layer 40, and $W_1'$ be the height of the second semiconductor layer 40, the channel width is $(2W_1' + d_1')$, obtaining $\phi_1 = (2W_1' + d_1') \times Lg_1$.

Since $d_1 \approx d_1' < W_1'$, $\sigma_1 = d_1 \times Lg_1 << (2W_1' + d_1') \times Lg_1 = \phi_1$. That is, $\sigma_1 << \phi_1$, and the junction area between the insulating layer 20 and the SiGe layer 30 is very small with respect to the element area.

In the MISFET shown in FIG. 1 which uses the conventional strained Si layer as a channel, letting $\sigma_2$ be the junction area between the insulating layer 120 and the SiGe layer 130 in one transistor (the area of a surface B in FIG. 1), $Lg_2$ be the gate length (width in FIG. 1 corresponding to the channel length), and $W_2$ be the gate length (depth in FIG. 1), $\sigma_2 = Lg_2 \times W_2$.

Letting $\phi_2$ be the area (element area) of the channel formation surface of one transistor, the element area is expressed by $\phi_2 = Lg_2 \times W_2$.

In other words, $\sigma_2 = Lg_2 \times W_2 = \phi_2$. The junction area between the insulating layer 120 and the SiGe layer 130 in one transistor is equal to the element area.

As is apparent from the comparison between the structure of FIGS. 3A and 3B and the structure of FIG. 1, the first embodiment decreases the junction area between the insulating layer and the SiGe layer with respect to the element size of one transistor, and reduces the adverse effect of interface defects and the like.

The first semiconductor layer 30 is a SiGe layer, and the second semiconductor layer 40 is a Si layer in the first embodiment, but SiGe and Si can be exchanged. In this case, in FIGS. 2, 3A, and 3B, the first semiconductor layer 30 is a Si layer, and the second semiconductor layer 40 is a SiGe layer.

(Second Embodiment)

The second embodiment is directed to a MISFET manufacturing method according to the present invention. For easy understanding, the same reference numerals as in the first embodiment of FIG. 2 denote the same parts.

Figure 4:
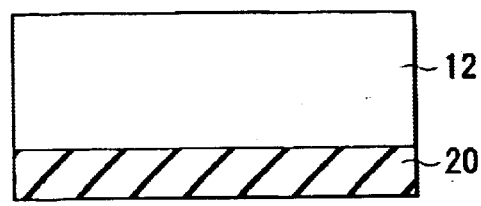
FIGS. 4 to 8 are sectional views, respectively, showing the steps of a process of manufacturing the board-like active region of a MISFET according to the second embodiment.

As shown in FIG. 4, an SGOI (SiGe On Insulator) substrate obtained by stacking a lattice-relaxed SiGe crystal layer 12 as the first semiconductor layer on an insulating layer 20 made of silicon oxide is prepared.

The SGOI substrate manufacturing method is not particularly limited. For example, a SiGe crystal layer is epitaxially grown on a silicon wafer. Oxygen ions are implanted into the SiGe crystal layer by SIMOX (Separation by IMplanted Oxygen) to form an insulating layer (silicon oxide layer) in the SiGe crystal layer. Alternatively, the second silicon wafer prepared by growing a SiGe crystal layer on the surface is bonded to the first silicon wafer prepared by thermally oxidizing the surface to form an insulating layer (silicon oxide layer). After that, the second silicon wafer is removed while the SiGe crystal layer is left on the surface of the insulating layer on the first silicon wafer. The SGOI substrate obtained by these methods may be effectively combined with a method which performs additional high-temperature thermal oxidization to thin the SiGe crystal layer on the insulating layer so as to increase the Ge concentration in the SiGe crystal layer.

The second embodiment employs an SGOI substrate in which the insulating layer 20 is made of a 100-nm thick silicon oxide and a 100-nm thick SiGe crystal layer 12 with a Ge composition of 10 atomic % is formed on the insulating layer 20.

The layer thickness of the insulating layer 20 is not particularly limited in terms of the process. However, the thickness of the insulating layer 20 is desirably 1 nm or more because the SiGe crystal layer on the insulating layer 20, a strained Si layer, or the like is selectively etched using the difference in etching rate from the insulating layer 20 in the subsequent step.

The SiGe crystal layer 12 desirably has a (001) or equivalent plane or (011) or equivalent plane. The thickness of the formed SiGe crystal layer 12 must be larger than the height of a projection (board) formed from the SiGe crystal layer upon making an element.

Figure 5:
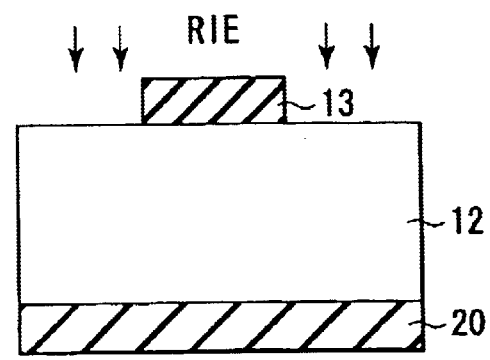

To form a board for an element, a mask 13 made of silicon oxide or silicon nitride is formed on the surface of the SiGe crystal layer 12, as shown in FIG. 5.

To form the mask 13, a thermal oxide layer is formed on the SiGe crystal layer 12, or a silicon nitride layer is deposited by CVD. A resist pattern is formed on the thermal oxide layer or silicon nitride layer, and the thermal oxide layer or silicon nitride layer is etched using the resist pattern as a mask.

Figure 6:
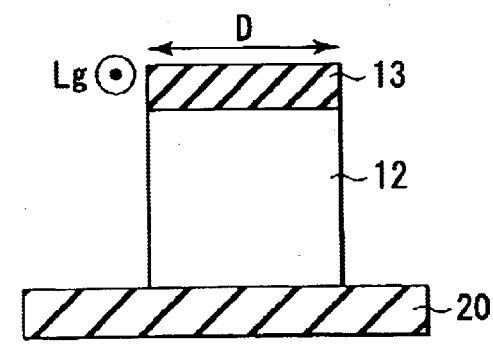

The SiGe crystal layer 12 except a portion to be left as a board is removed using the mask 13 by dry etching, for example, RIE, exposing an insulating layer 11, as shown in FIG. 6. In the second embodiment, the mask 13 has a width D of 40 nm and a depth Lg (in this case, length perpendicular to the sheet surface of FIG. 6) of 2 $\mu$m. At this time, the side surface of the SiGe crystal layer 12 desirably has a (010) or equivalent plane or (100) or equivalent plane. A (110) or equivalent plane can also be permitted.

Figure 7:
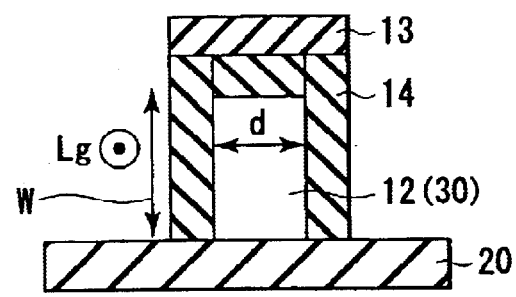

To recover the board surface damaged by dry etching, the SiGe crystal layer 12 is thermally oxidized while the mask 13 is left, as shown in FIG. 7.

Figure 8:
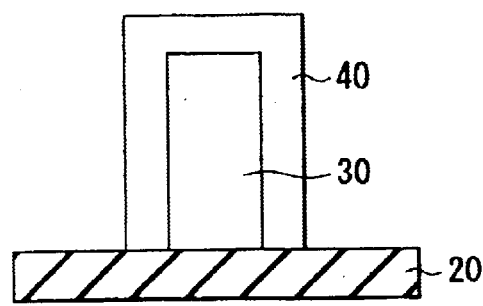

In the use of the thermal oxide layer as the mask 13, the side surface of the SiGe crystal layer 12 and its upper surface covered with the mask 13 are oxidized during thermal oxidization, newly forming a silicon oxide layer 14. At this time, Ge atoms are kicked out from the silicon oxide layer 14. Thus, the remaining SiGe crystal layer 12 is downsized, and the internal Ge concentration increases, forming a final SiGe crystal layer 30 (FIG. 8).

In the use of silicon nitride as the mask 13, the upper surface covered with the mask 13 does not oxidize, but the side surface not covered with the mask 13 oxidizes, forming the silicon oxide layer 14. Ge atoms are kicked out from the silicon oxide layer 14, and the remaining SiGe crystal layer increases the Ge concentration and decreases the width.

In the second embodiment, silicon nitride is used as the mask 13, and the side surfaces of the SiGe crystal layer 12 with the width D of 40 nm are oxidized one by one every 10 nm. A width d of the SiGe crystal layer 12 is decreased by 10 nm for single surface and 20 nm for both surfaces, leaving the 20-nm thick SiGe crystal layer 12. The Ge composition of the SiGe crystal layer 12 (30) increases to 20 atomic %.

As the thermal oxidization condition, for example, the processing temperature is desirably high enough to recover the crystal structure of the SiGe crystal layer, and lower than the melting point of SiGe. More specifically, the processing temperature is desirably 900° C. (inclusive) to 1,350° C. (inclusive), and more desirably 1,000° C. (inclusive) to 1,350° C. (inclusive). The temperature must be carefully set because the melting point of SiGe decreases as the Ge concentration increases. As long as the thermal oxidization temperature falls within this range, Ge atoms kicked out from the oxide layer 14 do not pile up on the interface between the insulating layer 20 and the SiGe crystal layer 30, hardly generating defects. The thermal oxidization atmosphere is, for example, an atmosphere with an oxygen concentration of 5% to 100%.

In the second embodiment, the width d of the board formed from the SiGe crystal layer 30 is desirably 10 nm (inclusive) to 50 nm (inclusive) in order to strain a Si crystal layer to be formed in the subsequent step. The depth (in this case, a length in a direction perpendicular to the sheet surface of FIG. 6) of the board formed from the SiGe crystal layer 30 determines the sum of the channel gate length and source/drain electrode length, and falls within the range of 0.5 μm (inclusive) to 5 μm (inclusive). A board height W determines the channel gate width, and must be 50 nm or more. The maximum value is hardly limited in terms of the element design, but is desirably 1 μm or less because a large board height or a high ratio (aspect ratio) of the height to the bottom makes the process difficult.

As shown in FIG. 8, the mask 13 and thermal oxide layer 14 are removed by wet etching or the like. After surface processing, a Si layer is grown to a thickness of 7 nm on the surface of the SiGe crystal layer 30 by epitaxial growth. The Si layer is a strained Si layer 40 as the second semiconductor layer. The thickness of the strained Si layer 40 is desirably 5 nm (inclusive) to 30 nm (inclusive).

The obtained board having the strained Si layer on the surface undergoes gate processing and source/drain processing, completing the MISFET.

The process of forming a MISFET using the obtained board having the strained Si layer on the surface will be described in detail. MISFET formation processes are roughly classified into two. One process is to perform source/drain processing after gate processing, similar to formation of a conventional planar MOSFET. The other process is to perform source/drain processing first and then gate processing.

In the second embodiment, an embodiment of the process of performing gate processing first will be explained with reference to FIGS. 9A to 14C.

FIGS. 9A to 9C are schematic views showing the board obtained in the steps shown in FIGS. 4 to 8. A board in which a projecting SiGe crystal layer 30 is formed on a first insulating layer 20 made of silicon oxide and a strained Si layer 40 is formed on the surface of the SiGe crystal layer 30 is formed.

As shown in FIGS. 9A to 9C, the surface of the strained Si layer 40 is thermally oxidized to form a second insulating layer 70 as a gate insulating layer with a thickness of 4 nm. In the second embodiment, the second insulating layer 70 is made of silicon oxide. As a result, the thickness of the strained Si layer 40 becomes 5 nm. Poly-Si is deposited to a thickness of 200 nm on the entire surface of a second insulating layer 24 by CVD, forming a conductive layer 25 as a gate electrode. At this time, phosphorus is heavily doped in the conductive layer 25. Phosphorus may be doped at the same time as poly-Si deposition, or may be ion-implanted after poly-Si deposition.

A resist layer (not shown) is patterned on the conductive layer 25, and the conductive layer 25 is etched using the resist layer as a mask. As a result, a shown in FIG. 11A, a band-like gate electrode 80 is formed on the surface of a part of the second insulating layer 70. At this time, an impurity such as boron is desirably ion-implanted to form source and drain regions in the board by utilizing the resist layer used as the mask in gate processing. In FIG. 11C, the boundary of the doped region is represented by the dotted line.

Thereafter, the side wall of the gate electrode 25 is formed. As shown in FIGS. 12A to 12C, a third insulating layer 26 is deposited by CVD on the entire surfaces of the gate electrode 80, exposed second insulating layer 70, and exposed first insulating layer 20. The third insulating layer 26 is made of silicon oxide, and will function as a sidewall insulator later.

Figure 13A:
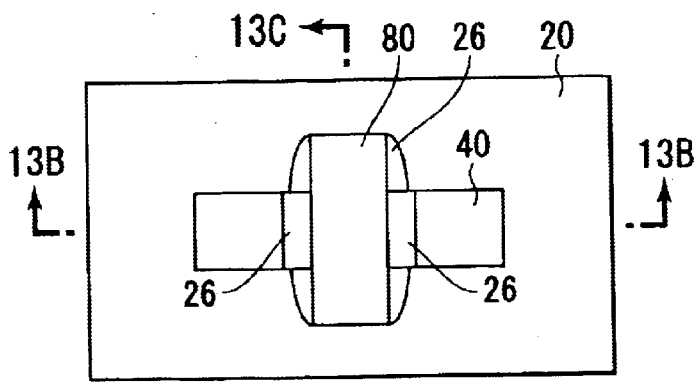
Figure 13C:
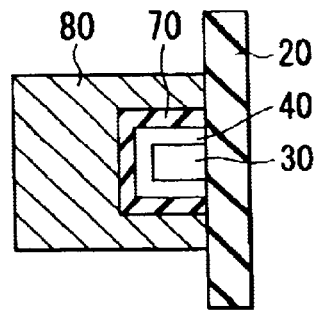
Figure 13B:
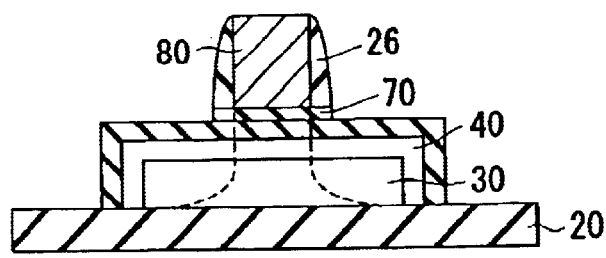

As shown in FIGS. 13A to 13C, the third insulating layer 26 is selectively etched to leave the sidewall insulating layer 26 on only the side surface of the gate electrode 80. At this time, the selective etching condition is so set as to expose the gate electrode 80. The gate electrode 80 and gate insulating layer 70 are different in upper surface level. Thus, only the side wall insulating layer 26 on the side surface of the gate electrode 80 and the second insulating layer 70 (gate insulating layer 70) below the side wall insulating layer 26 are left. The remaining third insulating layer 26 and second insulating layer 70 are completely removed. Accordingly, the strained Si layer 40 is exposed except the portion which is covered with the board-like gate electrode 80, sidewall insulating layer 26, and second insulating layer 70.

Figure 14A:
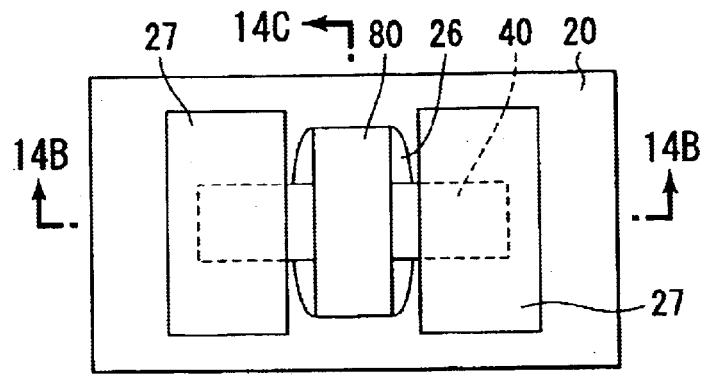
Figure 14C:
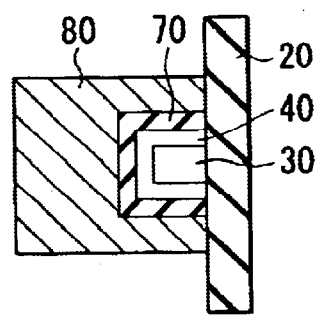
Figure 14B:
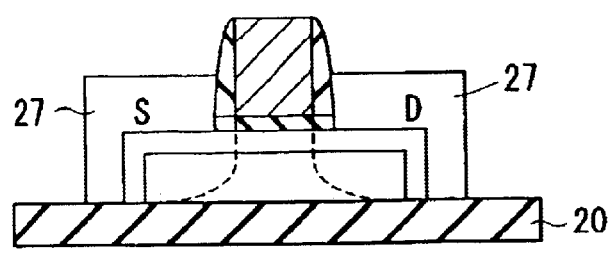

As shown in FIGS. 14A to 14C, semiconductor layers 27 as source and drain regions are formed by Si selective growth on the surface of the exposed strained Si layer 40. In this case, the new semiconductor layers 27 are grown selectively on regions where the strained Si layer 40 is exposed. At this time, Si is selectively grown while an impurity such as boron is doped, thus doping the impurity in the source and drain regions. Electrodes (not shown) are formed in the gate, source, and drain, completing the MISFET.

(Third Embodiment)

The third embodiment adopts the process of performing source/drain processing first and then gate processing. A method of forming one MISFET having a pair of source and drain regions for a plurality of boards will be described. More specifically, a MISFET made up of two boards will be exemplified.

A MISFET manufacturing method according to the third embodiment will be explained with reference to FIGS. 15A to 20C. For easy understanding, the same reference numerals as in the first embodiment of FIG. 2 denote the same parts.

Similar to the second embodiment, as shown in FIGS. 15A to 15C, an SGOI substrate obtained by stacking a lattice-relaxed SiGe crystal layer (first semiconductor layer) 30 on an insulating layer 20 is prepared.

The third embodiment employs an SGOI substrate in which the insulating layer 20 is made of 100-nm thick silicon oxide and a 200-nm thick SiGe crystal layer 30 with a Ge composition of 10 atomic % is formed on the insulating layer 20.

A silicon oxide layer 33 is deposited to a thickness of 10 nm on the SGOI substrate by CVD, and a 10-nm thick silicon nitride layer 34 is stacked. The silicon nitride layer 34 is removed except portions serving as source and drain regions, exposing the silicon oxide layer 33. The silicon oxide layer 33 is selectively removed except a portion serving as a board, exposing the SiGe crystal layer 30. This structure is shown in FIGS. 16A to 16C. The width of the silicon oxide layer 33 which will cover the board later is 250 nm.

Figure 17A:
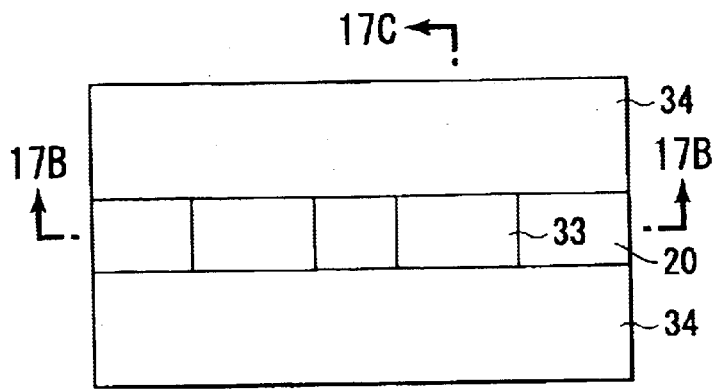
Figure 17C:
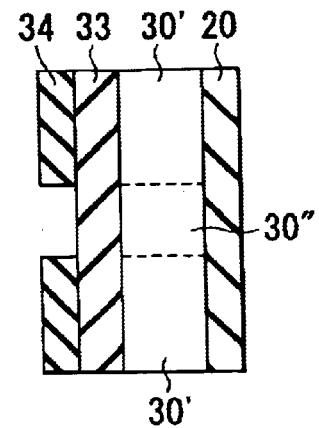
Figure 17B:
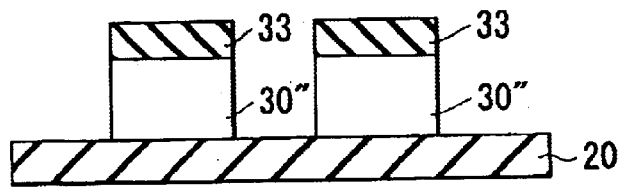

As shown in FIGS. 17A to 17C, the SiGe crystal layer 30 around the board is dry-etched away to form the projection of the board. As a result, SiGe crystal layers 30" are formed as two boards between SiGe crystal layers 30' serving as source and drain regions. The side surface of the SiGe crystal layer 30" serving as a board is desirably a (010) plane.

Figure 18A:
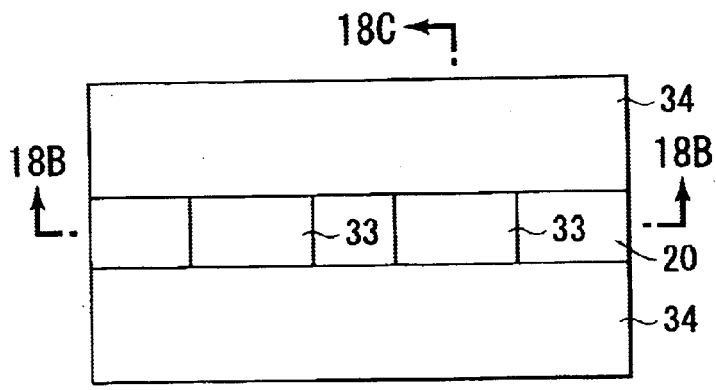
Figure 18C:
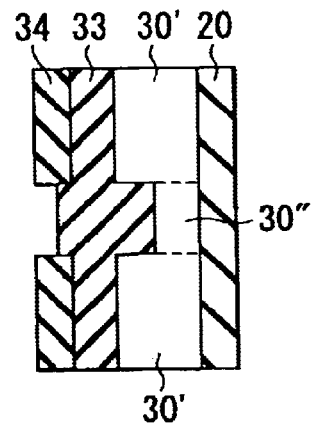
Figure 18B:
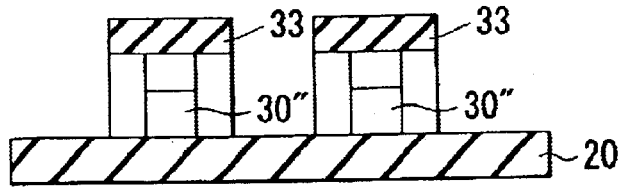

Subsequently, thermal oxidization is performed at an oxidization temperature of 1,000° C. or more. This state is illustrated in FIGS. 18A to 18C. At this time, the SiGe crystal layer 30' which has a surface covered with the silicon nitride layer 34 and serves as a source/drain region does not oxidize. However, the SiGe crystal layer 30" which is not covered with the silicon nitride layer 34 and serves as a board oxidizes. That is, oxidization of the SiGe crystal layer 30" serving as a board progresses from the top covered with the silicon oxide layer 33 and the side surface not covered with the silicon oxide layer 33. By thermal oxidization, the SiGe crystal layer 30" as a board oxidizes by a thickness of about 100 nm. As a result, the SiGe crystal layer 30" as a board has a height of 100 nm and a width of 30 nm. In this case, the thin silicon oxide layer 33 is formed on the upper surface of the SiGe layer 30" serving as a board, and the oxidation speed is slightly higher on the side surface at the start of oxidization.

Figure 19A:
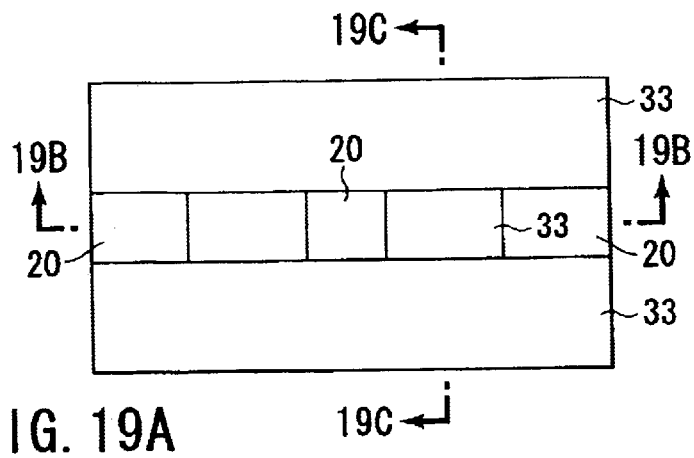
Figure 19C:
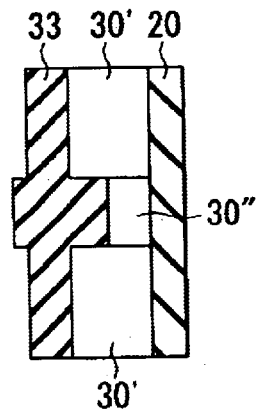
Figure 19B:
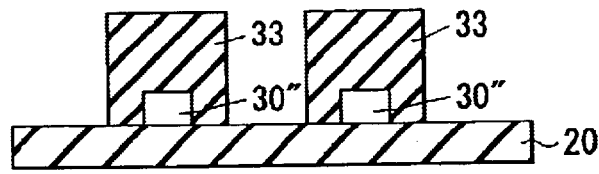

As shown in FIGS. 19A to 19C, the silicon nitride layers 34 are removed from portions serving as source and drain regions, and phosphorus ions are implanted into the substrate via the silicon oxide layers 33. Ions are implanted into the SiGe layers 30' serving as source and drain regions. However, no ion is implanted into the SiGe layers 30" serving as boards because the SiGe layers 30" are covered with the silicon oxide layers 33 which have become thick by thermal oxidization.

Figure 20A:
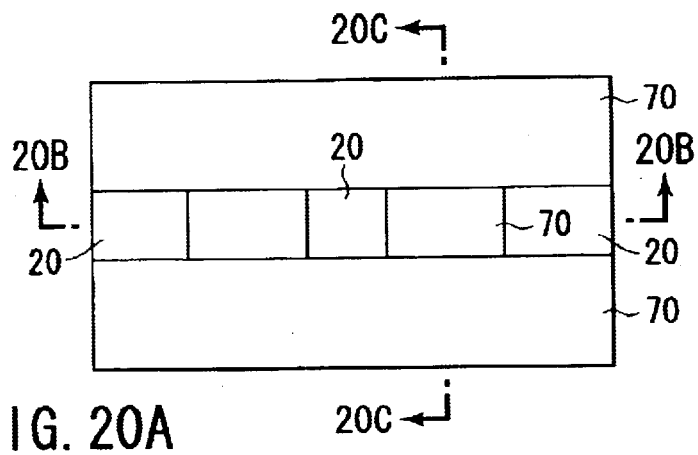
Figure 20C:
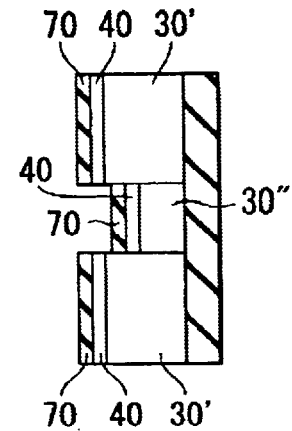
Figure 20B:
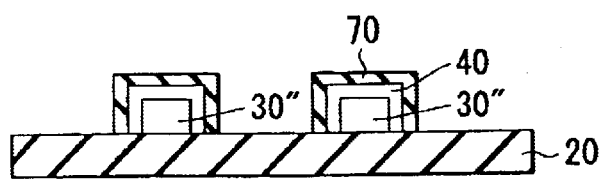

As shown in FIGS. 20A to 20C, the silicon oxide layers 33 are removed from the surfaces of the source and drain regions and the boards, exposing the surfaces of the SiGe crystal layers 30' and 30". Strained Si layers 40 are grown as the second semiconductor layers to a thickness of 10 nm on the surfaces of the SiGe crystal layers 30' and 30" by selective growth. The surfaces of the strained Si layers 40 are thermally oxidized to a thickness of 3 nm, forming gate insulating layers 70 from silicon oxide. The heating temperature is desirably 850° C. or less in order to prevent Ge diffusion and maintain a high-quality Si/SiGe interface.

As shown in FIGS. 21A to 21C, sidewall insulating films 36 are formed by a well-known method on the side surfaces of the SiGe crystal layers 30' and Si layers 40 that are exposed at the board formation portion. After that, a polysilicon layer 37 is deposited by CVD so as to fill the gap between the boards. In this case, boron is doped in the polysilicon layer 37. Boron may be doped at the same time as CVD deposition, or may be ion-implanted later.

As shown in FIGS. 22A to 22C, the polysilicon layer 37 is removed while leaving it by the gate width, thus forming a gate electrode 80. Electrodes (not shown) are formed in the source and drain regions and the polysilicon portion, completing the MISFET.

Note that the first to third embodiments employ a structure in which the center of a board is formed from a relaxed SiGe crystal, the surface is covered with a strained silicon layer, and the strained silicon layer functions as a channel. In a structure in which the center of a board is formed from a general Si crystal, the surface is covered with a strained SiGe crystal layer, and the strained SiGe layer functions as a channel, the hole mobility increases. When the SiGe layer is used as a channel, the SiGe layer is directly oxidized as a gate insulating layer. In addition to this method, a Si layer with a thickness of about 2 to 5 nm (about half the thickness of an oxide layer) is stacked on the SiGe layer and oxidized. In direct SiGe oxidization, Ge atoms kicked out from the oxide layer may undesirably degrade the interface characteristic. The method of oxidizing the Si layer is free from this problem. However, if the Si layer is excessively thick, the Si layer remains between the channel and the gate oxide layer, degrading characteristics such as the mobility.

(Fourth Embodiment)

A p-channel MISFET is formed with a structure in which the first semiconductor layer is made of Si and the second semiconductor layer is formed from a strained SiGe layer. An n-channel MISFET is formed with a structure in which the first semiconductor layer is formed from a SiGe crystal layer and the second semiconductor layer is made of strained Si. The p- and n-channel MISFETs can be combined into a complementary field effect transistor (CMIS). In this case, a substrate in which a silicon layer region and relaxed SiGe layer region coexist on an insulating layer must be prepared. In other words, designated positions on the substrate must be made of Si and SiGe. The fourth embodiment is directed to a method of manufacturing this substrate.

Figure 23A:
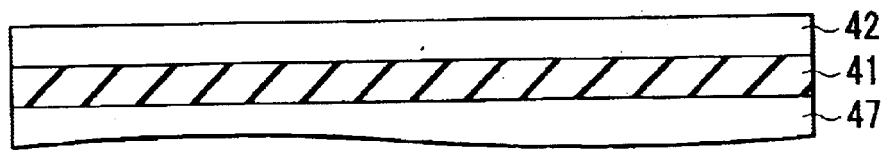
FIGS. 23A to 23F are sectional views of a substrate showing a Si/SiGe hybrid substrate manufacturing process according to the fourth embodiment.

As shown in FIG. 23A, a general SOI substrate (substrate in which a silicon layer 42 (SOI layer) is stacked on an insulating layer 41: in general, a buried insulating film and silicon layer are formed on a silicon wafer) is prepared. The insulating layer 41 is made of silicon oxide. The thickness of the insulating layer 41 is not particularly limited. The thickness of the silicon layer 42 on the insulating layer 41 suffices to be about several nm (inclusive) to 200 nm (inclusive). In this case, an SOI substrate in which the thickness of the SOI layer 42 on the insulating layer 41 is 80 nm will be exemplified.

Figure 23B:
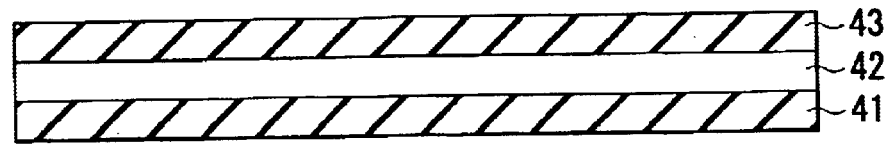
Figure 23C:
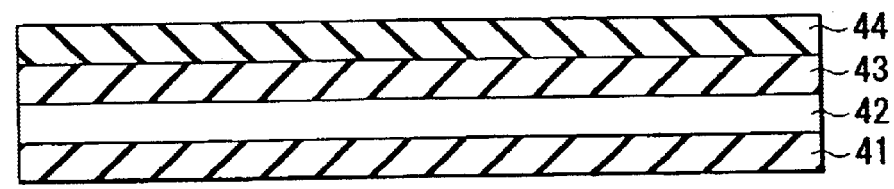

As shown in FIG. 23B, the entire surface of the SOI substrate is thermally oxidized to form a 20-nm thick silicon oxide layer 43 on the surface of the silicon layer 42. On this stage, the thickness of the silicon layer 42 is 70 nm. The silicon oxide layer 43 is covered with a 30-nm thick silicon nitride layer 44. The silicon nitride layer 44 is formed by CVD.

Figure 23D:
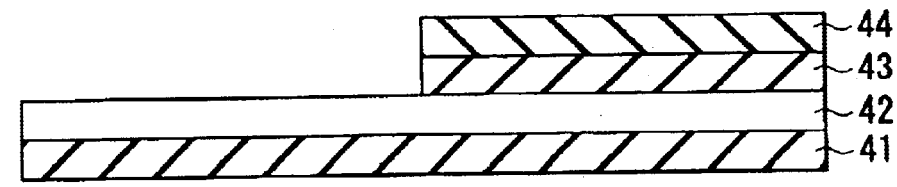

After a resist layer (not shown) is applied to the entire surface, the resist is removed by photolithography from a region where a SiGe layer is to be formed without leaving any silicon layer, while leaving it in only a region where the silicon layer is to be left. As shown in FIG. 23D, the silicon nitride layer 44 and silicon oxide layer 43 at the opening are etched using the resist (not shown) as a mask. The remaining resist is removed to expose the silicon layer 42.

Figure 23E:
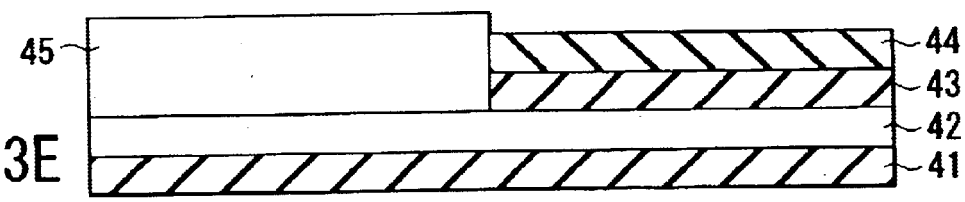

As shown in FIG. 23E, a 140-nm thick SiGe layer 45 with a Ge composition of 15 atomic % is grown at only the exposed portion of the silicon layer 42 by selective growth.

Figure 23F:
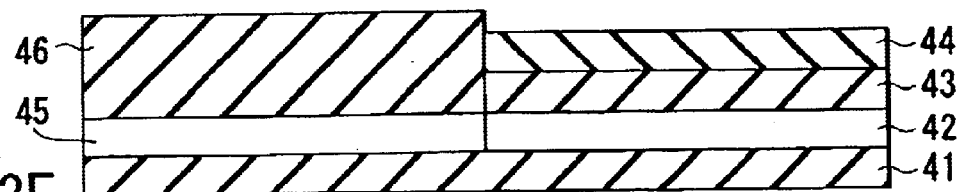

As shown in FIG. 23F, thermal oxidization is performed to form a silicon oxide layer 46 on the SiGe layer 45. At the same time, Ge atoms in the SiGe layer 45 are diffused into the silicon layer 42 to change the silicon layer 42 into a single SiGe layer 45. At this time, the thermal oxidization temperature is desirably 900° C. or more, and more desirably 1,000° C. or more. By high-temperature thermal oxidization, a 280-nm thick oxide layer 46 is formed on the SiGe layer 45. In this thermal oxidization, Ge atoms do not migrate into the silicon oxide layer 46, but are kicked out into the SiGe layer 45. Further, Ge atoms in the SiGe layer 45 are diffused into the silicon layer 42 prepared first, and the multilayered structure of the silicon layer and SiGe layer changes into a single SiGe layer. As a result, a 70-nm thick SiGe layer region with a Ge composition of 30 atomic % is formed on the insulating layer 41.

During this process, oxidation does not progress at a portion covered with the silicon nitride layer 44. That is, the original silicon layer 44 remains. Hence, a 70-nm thick silicon layer region and a 70-nm thick SiGe layer region with a Ge composition of 30 atomic % can be selectively formed on the substrate. Finally, the oxide layer 46, silicon nitride layer 44, and silicon oxide layer 43 are removed by RIE.

An n-channel transistor and p-channel transistor are formed on the prepared semiconductor substrate by, for example, the method as described in the second embodiment, obtaining a CMIS semiconductor device.

(Fifth Embodiment)

The fifth embodiment will describe a method of forming a board CMISFET having the same structure as that of the first embodiment or a conventional CMISFET on the SOI/SGOI (Silicon Germanium On Insulator) hybrid substrate fabricated in the fourth embodiment.

Figure 24:
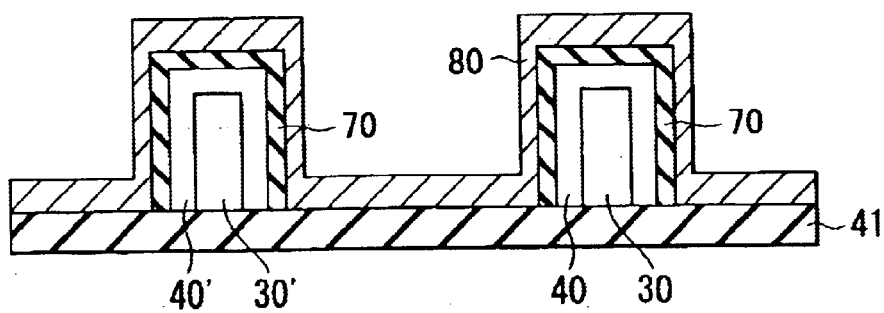
FIG. 24 is a sectional view showing a CMISFET according to the fifth embodiment.

In the fifth embodiment, as shown in FIG. 24, an n-channel MISFET in which a strained Si layer 40' is stacked on a lattice-relaxed board SiGe crystal layer 30' and used as a channel is formed at the SGOI portion, similar to the first embodiment. A p-channel MISFET in which a strained SiGe layer 40 is stacked on a board-like Si crystal layer 30 and used as a channel is formed at the SOI portion. The two MISFETs formed in this manner share, for example, a gate electrode 80, and the two drain ends are short-circuited to configure an inverter circuit.

FIGS. 25A to 25E show the process of forming a CMIS. The same reference numerals as in the first to fourth embodiments denote the same parts, and a repetitive description thereof will be omitted. With the SOI/SGOI hybrid substrate, a board p-channel MISFET using a strained SiGe layer as a channel is formed at the SOI portion, and a board n-channel MISFET using a Si layer as a channel is formed at the SGOI portion, thereby forming a CMIS.

Figure 25A:
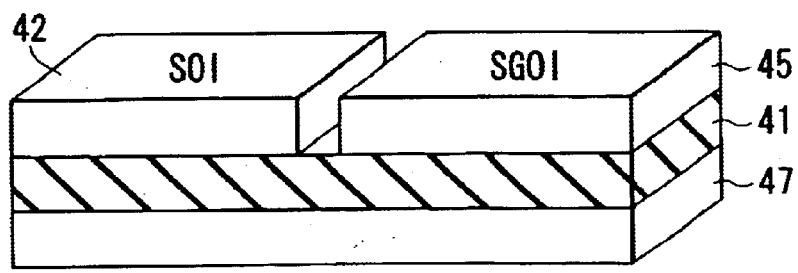
FIGS. 25A to 25D are perspective views, respectively, showing the steps of a CMISFET manufacturing process according to the fifth embodiment.
Figure 25B:
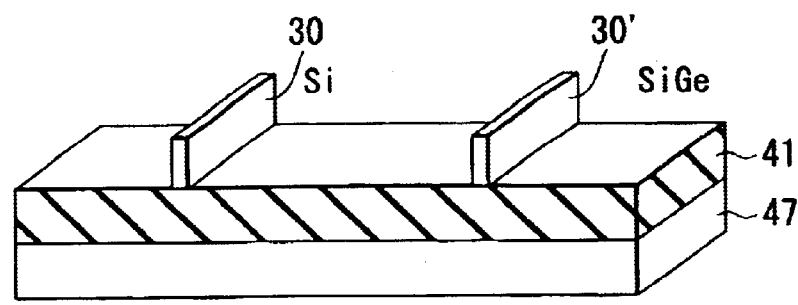

An SOI/SGOI hybrid substrate is first prepared by the method of the fourth embodiment, then the SOI and SGOI regions are insulatively separated from each other, and the insulating film on the surface is removed (FIG. 25A). By the method of the first embodiment, board-like projections 30 and 30' are formed in both the SOI and SGOI regions (FIG. 25B).

Figure 25C:
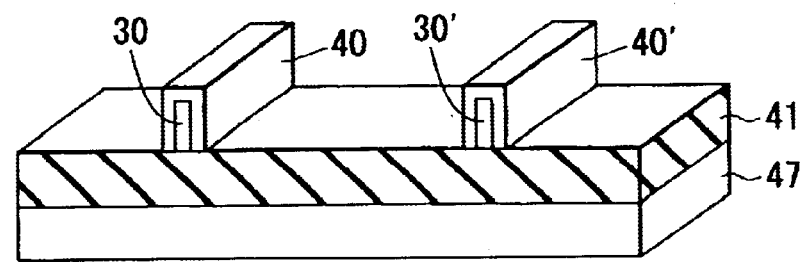
Figure 25D:
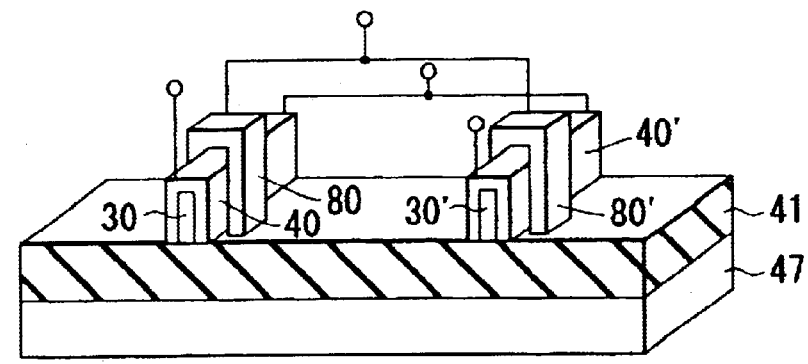

By regrowth, a strained SiGe layer 40 is grown on the Si-board 30, and a strained Si layer 40' is grown on the SiGe-board 30' (FIG. 25C). A gate electrode 80 and source and drain regions (not shown) are formed, completing the CMIS circuit (FIG. 25D).

Figure 26:
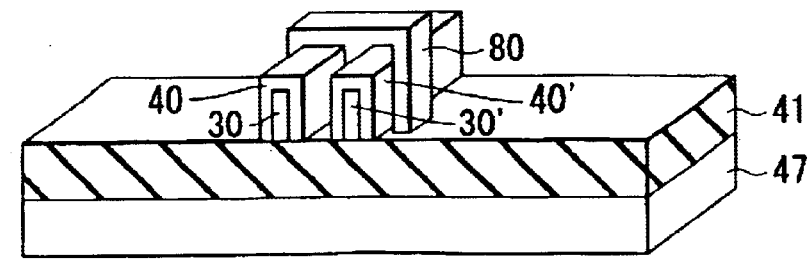
FIG. 26 is a perspective view showing a modification to gate electrode formation in the fifth embodiment.

In this process, the p- and n-channel MISFETs are simultaneously formed. It is also possible to form a p- or n-channel MISFET first and then form the other MISFET. In an arrangement in which the gate electrodes of n- and p-channel MISFETs are short-circuited, like a CMIS inverter circuit, two n- and p-channel board MISFETs can be arranged close to each other and share the gate electrode 80, as shown in FIG. 26.

In the fifth embodiment, a CMIS circuit made up of a p-channel strained-SiGe MISFET and n-channel strained-Si MISFET is formed from board MISFETs. Alternatively, a p-channel strained-Si MISFET and n-channel strained-Si MOSFET may be formed using an SGOI substrate as a base. Also in this case, the final view is FIG. 25D or 26. The first semiconductor layers 30 and 30' are SiGe layers, and the second semiconductor layers 40 and 40' are strained Si layers.

Figure 27:
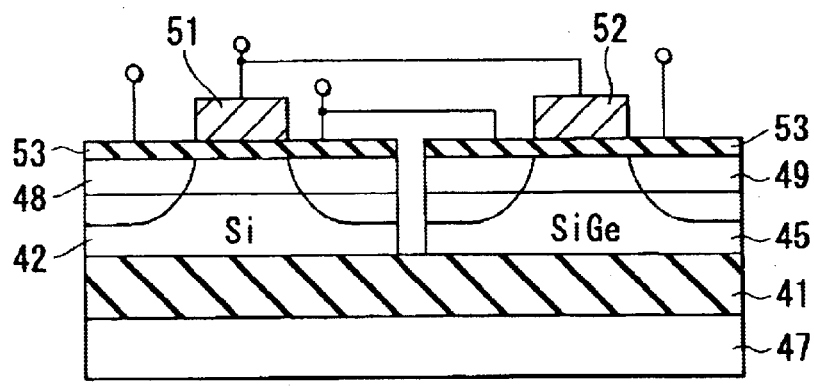
FIG. 27 is a sectional view showing an embodiment in which a planar CMISFET is formed using a Si/SiGe hybrid substrate according to the fourth embodiment.

When the SOI/SGOI hybrid substrate is prepared, the CMIS circuit made up of the p-type strained-SiGe MISFET and n-type strained-Si MISFET need not always be formed from board MISFETs. Even conventional planar MISFETs can configure a high-performance CMIS circuit (FIG. 27).

As a detailed structure, for example, a 15-nm thick strained SiGe layer 48 with a Ge composition of 25% is stacked on a 50-nm thick SOI layer 42, forming a p-channel layer. A 15-nm thick strained Si channel layer 49 is stacked on an SGOI layer 45 with a Ge composition of 30%.

Figure 28:
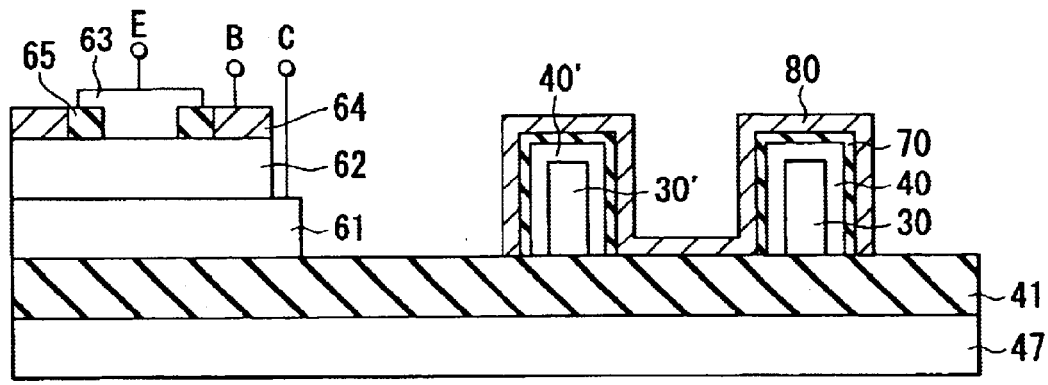
FIG. 28 is a sectional view showing a combination of a board CMISFET according to the fifth embodiment and an HBT.

In addition, an HBT (Hetero Bipolar Transistor) can be added to a CMIS circuit made up of a p-type strained-SiGe MISFET and n-type strained-Si MISFET which are formed on an SOI/SGOI substrate. FIG. 28 shows an example in which an HBT is added to the SOI substrate portion of a CMIS circuit made up of a p-channel strained-SiGe MISFET and n-channel strained-Si MOSFET as shown in FIG. 26.

As the HBT layer structure, a 200-nm thick SOI collector 61 is formed as the lowermost layer. A 30-nm thick base layer 62 (containing a heavy p-type dopant) with a Ge composition of 15% is formed on the collector 61. An n-type Si emitter layer 63 is formed as the uppermost layer. Reference numeral 64 denotes a base electrode; and 65, an isolation.

Figure 29:
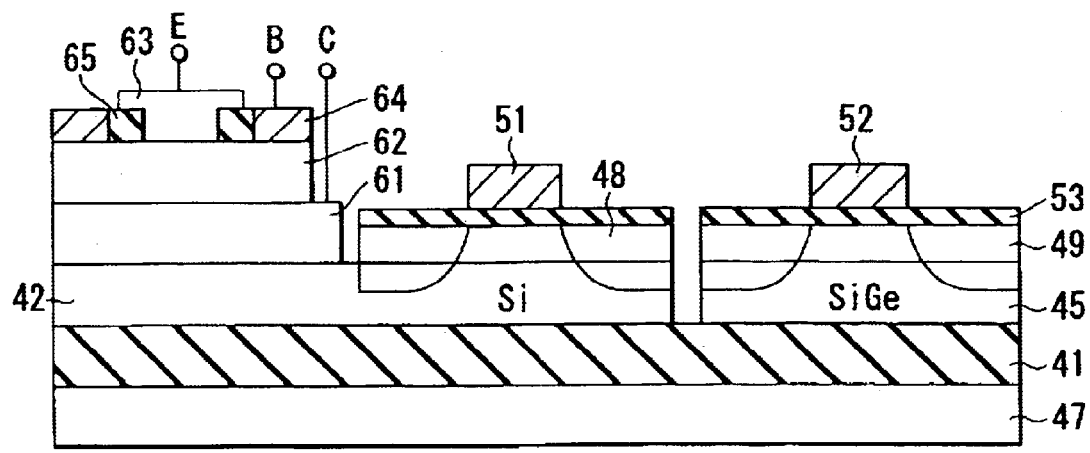
FIG. 29 is a sectional view showing a combination of the planar CMISFET in FIG. 27 and the HBT.

The MISFET has a board structure in FIG. 28, but can be formed from a planar FET, as shown in FIG. 29. In this case, the thickness required for the collector layer 61 is larger than that of the p-type MOSFET SOI layer 42. Thus, the Si layer 61 is deposited until the required thickness before the base layer formation by CVD or other deposition methods. At this time, an n-type impurity is doped in the collector layer 61. In addition to the HBT, an electronic element which can be implemented by SOI can coexist.

In this manner, an n-channel strained-Si MISFET capable of increasing the electron mobility and a p-channel strained-SiGe MISFET capable of increasing the hole mobility can be easily combined on an SOI/SGOI hybrid substrate. Moreover, a Si layer and thin film strained Si layer can be formed. High-speed strained-Si MISFETs can be combined with an almost perfect electronic circuit formed from a conventional Si element.

Figure 30:
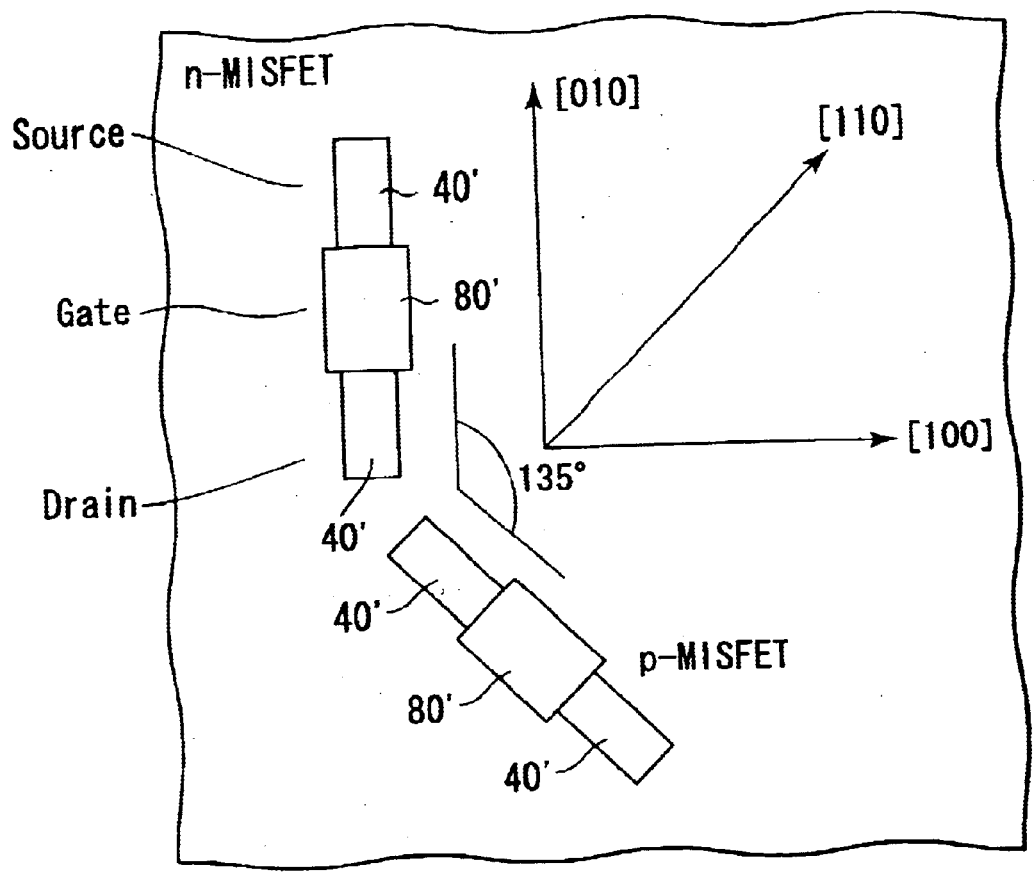
FIG. 30 is a schematic plan view showing an embodiment to form a CMISFET using desirable crystal orientations.

As aforementioned, an electron mobility in a strained silicon layer is optimized in a (100) or equivalent plane, and a hole mobility in a (110) or equivalent plane. Therefore, utilization of these surface orientations enables MISFETs or CMISFETs having higher performance. FIG. 30 schematically shows a layout (top view) of a structure wherein an n-channel MISFET and a p-channel MISFET include channels each having a different crystal orientation. The n-channel MISFET and p-channel MISFET are arranged such that current directions of both MISFETs cross each other having an angle of 45 or 135 degree. This structure also enables a combination of an n-channel MISFET having a (100) plane and a p-channel MISFET having a (110) plane. A (001) plane may be used instead of a (100) plane, and a (011) plane instead of a (110) plane.

Note that, in FIG. 30, the same reference numerals as in FIG. 25D of the fifth embodiment are used, and duplicated explanations are omitted.

Figure 31:
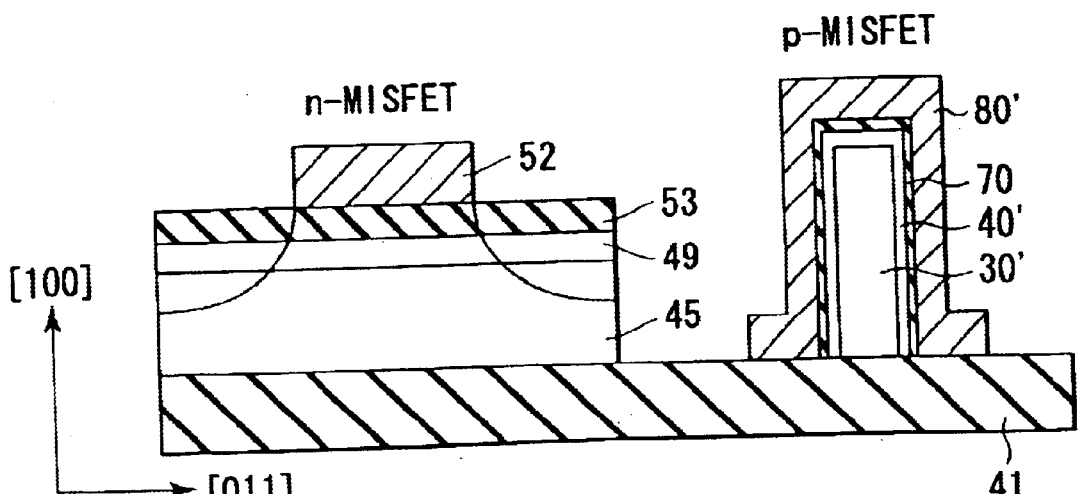
FIG. 31 is a cross sectional view showing an embodiment to form a CMISFET combining a board p-channel MISFET and a planar n-channel MISFET.

FIG. 31 shows an another layout wherein a combination of a planar n-channel MISFET having a channel formed in a (100) plane and a board p-channel MISFET having a channel formed in a (011) plane is realized. In this case, a strained Si layer is formed on a (001) plane of an SGOI substrate, on which a planar n-channel MISFET is formed, and a board p-channel MISFET is formed in such a manner as aforementioned, so as to have a strained Si channel of a (011) plane formed over a relaxed SiGe board. Even such a structure can realize a combination of an n-channel MISFET having a (100) channel plane and a p-channel MISFET having a (110) channel plane.

Note that, in FIG. 31, the same reference numerals as in FIG. 25D are used for p-channel MISFET, the same reference numerals as in FIG. 27 are used for n-channel MISFET, and duplicated explanations are omitted.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   an insulating layer having a major surface;
   a semiconductor board formed on a selected portion of the major surface of the insulating layer, the semiconductor board having a bottom surface in contact with the major surface of the insulating layer, at least two planar major side surfaces in parallel to each other, and substantially perpendicular to the major surface of the insulating layer, and an upper surface opposed to the bottom surface;
   a semiconductor layer formed on at least one of the major side surfaces of the semiconductor board, the semiconductor layer having a lattice constant different from that of the semiconductor board, and having source and drain regions spaced apart from each other and a channel region between the source and drain regions, a channel length direction of the channel region being substantially parallel to the major surface of the insulating layer, and an area of the surface of the channel region being larger than the area of the bottom surface of the semiconductor board;
   a gate insulating layer formed on the channel region of the semiconductor layer; and
   a gate electrode formed on the gate insulating layer.

2. The device according to claim 1, wherein the semiconductor board is a SiGe board and the semiconductor layer is a strained Si layer.

3. The device according to claim 1, wherein the semiconductor board is a Si board and the semiconductor layer is a strained SiGe layer.

4. The device according to claim 1, further comprising:
   a bipolar transistor formed on the major surface of the insulating layer, and spaced apart from the selected portion where the semiconductor board is formed.

5. The device according to claim 4, wherein the semiconductor board, emitter and collector regions of the bipolar transistor are made of Si, a base region of the bipolar transistor is made of SiGe, and the semiconductor layer is a strained SiGe layer.

6. The device according to claim 4, wherein the semiconductor board and a base region of the bipolar transistor are made of SiGe, an emitter region of the bipolar transistor is made of Si, and the semiconductor layer is a strained Si layer.

7. The device according to claim 1, further comprising a semiconductor substrate which supports the insulating layer.

8. A manufacturing method of the semiconductor device according to claim 1, comprising:
   forming a multilayered structure of an insulating layer and a SiGe layer;
   oxidizing the multilayered structure to increase a Ge composition in the SiGe layer;
   etching the SiGe layer to form on the insulating layer a SiGe board having a bottom surface in contact with the insulating layer, at least two planar major side surfaces in parallel to each other and substantially perpendicular to a surface of the insulating layer, and an upper surface opposed to the bottom surface;
   forming a Si layer on at least one of the major side surfaces of the SiGe layer;
   forming a source region, a drain region, and a gate insulating layer on the Si layer, and
   forming a gate electrode on the gate insulating layer between the source and drain regions.

9. A semiconductor device comprising:
   an insulating layer having a major surface;
   a p-type semiconductor board formed on a first selected portion of the major surface of the insulating layer, the p-type semiconductor board having a bottom surface in contact with the major surface of the insulating layer, at least two planar major side surfaces in parallel to each other, and substantially perpendicular to the major surface of the insulating layer, and an upper surface opposed to the bottom surface of the p-type semiconductor board;
   a first semiconductor layer formed on at least one of the major side surfaces of the p-type semiconductor board, the first semiconductor layer having a lattice constant different from that of the p-type semiconductor board and having n-type source and drain regions spaced apart from each other and a first channel region provided in a p-type region between the n-type source and drain regions, a channel length direction of the first channel region being substantially parallel to the major surface of the insulating layer, and an area of the surface of the first channel region being larger than the area of the bottom surface of the p-type semiconductor board;
   a first gate insulating layer formed on the first channel region of the first semiconductor layer;
   a first gate electrode formed on the first gate insulating layer;
   an n-type semiconductor board formed on a second selected portion of the major surface of the insulating layer, the n-type semiconductor board having a bottom surface in contact with the major surface of the insulating layer, at least two planar major side surfaces in parallel to each other, and substantially perpendicular to the major surface of the insulating layer, and an upper surface opposed to the bottom surface of the n-type semiconductor board;

a second semiconductor layer formed on at least one of the major side surfaces of the n-type semiconductor board, the second semiconductor layer having a lattice constant different from that of the n-type semiconductor board and having p-type source and drain regions spaced apart from each other and a second channel region provided in an n-type region between the p-type source and drain regions, a channel length direction of the second channel region being substantially parallel to the major surface of the insulating layer, and an area of the surface of the second channel region being larger than the area of the bottom surface of the n-type semiconductor board;

a second gate insulating layer formed on the second channel region of the second semiconductor layer; and a second gate electrode formed on the second gate insulating layer.

10. The device according to claim 9, wherein the first channel region is formed in a (100) or equivalent plane of the first semiconductor layer, and the second channel region is formed in a (110) or equivalent plane of the second semiconductor layer.

11. The device according to claim 9, wherein the p-type semiconductor board is a p-type SiGe board, the first semiconductor layer is a strained Si layer, the n-type semiconductor board is an n-type SiGe board, and the second semiconductor layer is a strained Si layer.

12. The device according to claim 9, wherein the p-type semiconductor board is a p-type SiGe board, the first semiconductor layer is a strained Si layer, the n-type semiconductor board is an n-type Si board, and the second semiconductor layer is a strained SiGe layer.

13. The device according to claim 9, further comprising:

a bipolar transistor formed on the major surface of the insulating layer, and spaced apart from the first selected portion where the p-type semiconductor board is formed.

14. The device according to claim 13, wherein the p-type semiconductor board, and emitter and collector regions of the bipolar transistor are made of Si, a base region of the bipolar transistor is made of SiGe, and the first semiconductor layer is a strained SiGe layer.

15. The device according to claim 13, wherein the p-type semiconductor board is a SiGe board, the first semiconductor layer is a strained Si layer, the n-type semiconductor board is a Si board, the second semiconductor layer is a strained SiGe layer, emitter and collector regions of the bipolar transistor are formed in a Si layer, and the base region of the bipolar transistor are made of SiGe.

16. The device according to claim 9, further comprising a semiconductor substrate which supports the insulating layer.

17. A semiconductor device comprising:

an insulating layer having a major surface;

a first semiconductor board formed on a first selected portion of the major surface of the insulating layer, the first semiconductor board having a bottom surface in contact with the major surface of the insulating layer, at least two planar major side surfaces in parallel to each other and substantially perpendicular to the major surface of the first insulating layers, and an upper surface opposed to the bottom surface of the first semiconductor board;

a first semiconductor layer formed on at least one of the major side surfaces of the first semiconductor board, the first semiconductor layer having a lattice constant different from that of the first semiconductor board, and having a first source region and a first drain region spaced apart from each other and a first channel region provided between the first source region and the first drain region, a channel length direction of the first channel region being substantially parallel to the major surface of the insulating layer, and an area of the surface of the first channel region being larger than the area of the bottom surface of the first semiconductor board;

a first gate insulating layer formed on the first channel region of the first semiconductor layer;

a first gate electrode formed on the first gate insulating layer;

a second semiconductor board formed on a second selected portion of the major surface of the insulating layer, the second semiconductor board having a bottom surface in contact with the major surface of the insulating layer, at least two planar major side surfaces in parallel to each other and substantially perpendicular to the major surface of the second insulating layers, and an upper surface opposed to the bottom surface of the second semiconductor board;

a second semiconductor layer formed on at least one of the major side surfaces of the second semiconductor board, the second semiconductor layer having a lattice constant different from that of the second semiconductor board, and having a second source region and a second drain region spaced apart from each other and a second channel region provided between the second source region and the second drain region, a channel length direction of the second channel region being substantially parallel to the major surface of the insulating layer, and an area of the surface of the second channel region being larger than the area of the bottom surface of the second semiconductor board;

a second gate insulating layer formed on the second channel region of the second semiconductor layer;

a second gate electrode formed on the second gate insulating layer.

18. The device according to claim 17, wherein the first and second semiconductor boards are SiGe boards, and the first and second semiconductor layers are Si layers.

19. The device according to claim 17, wherein the first and second semiconductor boards are Si boards, and the first and second semiconductor layers are strained SiGe layers.

20. The device according to claim 17, further comprising a semiconductor substrate which supports the insulating layer.

* * * * *

UNITED STATES PATENT AND TRADEMARK OFFICE
CERTIFICATE OF CORRECTION

PATENT NO. : 6,774,390 B2  
DATED : August 10, 2004  
INVENTOR(S) : Sugiyama et al.

Page 1 of 1

It is certified that error appears in the above-identified patent and that said Letters Patent is hereby corrected as shown below:

Column 15,
Line 55, change "an area" to -- the area --.

Column 16,
Line 56, change "an area" to -- the area --.

Column 17,
Line 15, change "an area" to -- the area --.

Column 18,
Lines 17 and 45, change "an area" to -- the area --.

Signed and Sealed this

Fifth Day of April, 2005

JON W. DUDAS
*Director of the United States Patent and Trademark Office*